US012385987B2

United States Patent
Chiang et al.

(10) Patent No.: US 12,385,987 B2
(45) Date of Patent: Aug. 12, 2025

(54) MAGNETIC FIELD MEASURING METHOD, MAGNETIC FIELD MEASURING SYSTEM AND MAGNETIC FIELD MEASURING APPARATUS

(71) Applicant: HON HAI PRECISION INDUSTRY CO., LTD., New Taipei (TW)

(72) Inventors: Wei-Yin Chiang, New Taipei (TW); Min-Hsiu Hsieh, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 220 days.

(21) Appl. No.: 18/171,680

(22) Filed: Feb. 21, 2023

(65) Prior Publication Data

US 2023/0266409 A1   Aug. 24, 2023

Related U.S. Application Data

(60) Provisional application No. 63/268,313, filed on Feb. 21, 2022.

(30) Foreign Application Priority Data

Dec. 1, 2022 (TW) .................................. 111146198

(51) Int. Cl.
G01R 33/032 (2006.01)
G01R 33/02 (2006.01)

(52) U.S. Cl.
CPC ....... *G01R 33/032* (2013.01); *G01R 33/0213* (2013.01)

(58) Field of Classification Search
CPC .......................... G01R 33/032; G01R 33/0213
See application file for complete search history.

(56) References Cited

U.S. PATENT DOCUMENTS

2021/0109173 A1\* 4/2021 Lee ........................ G01R 33/26

\* cited by examiner

*Primary Examiner* — Stephanie E Bloss
*Assistant Examiner* — Michael A Harrison
(74) *Attorney, Agent, or Firm* — CKC & Partners Co., LLC

(57) ABSTRACT

A magnetic field measuring method includes: applying a magnetic field to a first particle and a second particle; generating a first output light by the first particle according to the magnetic field and a first coupling strength between the first particle and the second particle; and calculating a strength of the magnetic field according to a strength of the first output light. A magnetic field measuring system and a magnetic field measuring apparatus are also disclosed herein.

19 Claims, 4 Drawing Sheets

MAGNETIC FIELD MEASURING METHOD, MAGNETIC FIELD MEASURING SYSTEM AND MAGNETIC FIELD MEASURING APPARATUS

CROSS-REFERENCE TO RELATED APPLICATION

This application claims priority to and the benefit of TW Application Number 111146198, filed Dec. 1, 2022, which claims priority to and the benefit of U.S. Provisional Application No. 63/268,313, filed Feb. 21, 2022, entitled "Flexible magnetic sensing method utilizing radical pair system", which is incorporated herein by reference in its entirety for all purposes.

BACKGROUND

Technical Field

The present disclosure relates to a technology of magnetic field measurements. More particularly, the present disclosure relates to a magnetic field measuring method, a magnetic field measuring system and a magnetic field measuring apparatus.

Description of Related Art

When small cells or devices are observed, measurements for weak magnetic field are required. However, measuring devices for measuring weak magnetic field have various disadvantages, such as need to be operated under very low temperature environments, or the space resolution is not able to be adjusted. Thus, techniques associated with overcoming disadvantages described above are important issues in the field.

SUMMARY

The present disclosure provides a magnetic field measuring method. The magnetic field measuring method includes: applying a magnetic field to a first particle and a second particle; generating a first output light by the first particle according to the magnetic field and a first coupling strength between the first particle and the second particle; and calculating a strength of the magnetic field according to a strength of the first output light.

The present disclosure provides a magnetic field measuring system. The magnetic field measuring system includes a first particle, a second particle and a sensing device. The first particle is configured to generate a first output light according to a first coupling strength and a magnetic field. The second particle is configured to be coupled to the first particle with the first coupling strength. The sensing device is configured to generate a readout signal corresponding to a strength of the magnetic field according to a strength of the first output light.

The present disclosure provides a magnetic field measuring apparatus. The magnetic field measuring apparatus includes a first sensing module, a second sensing module, a first laser generating device, a second laser generating device and a moving device. The first sensing module is configured to calculate a first strength of a magnet field surrounding the first sensing module. The second sensing module is configured to calculate a second strength of the magnet field surrounding the second sensing module. The first laser generating device is configured to position the first sensing module. The second laser generating device is configured to position the second sensing module. The moving device is configured to move at least one of the first laser generating device and the second laser generating device, to adjust a distance between the first sensing module and the second sensing module.

It is to be understood that both the foregoing general description and the following detailed description are by examples, and are intended to provide further explanation of the disclosure as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
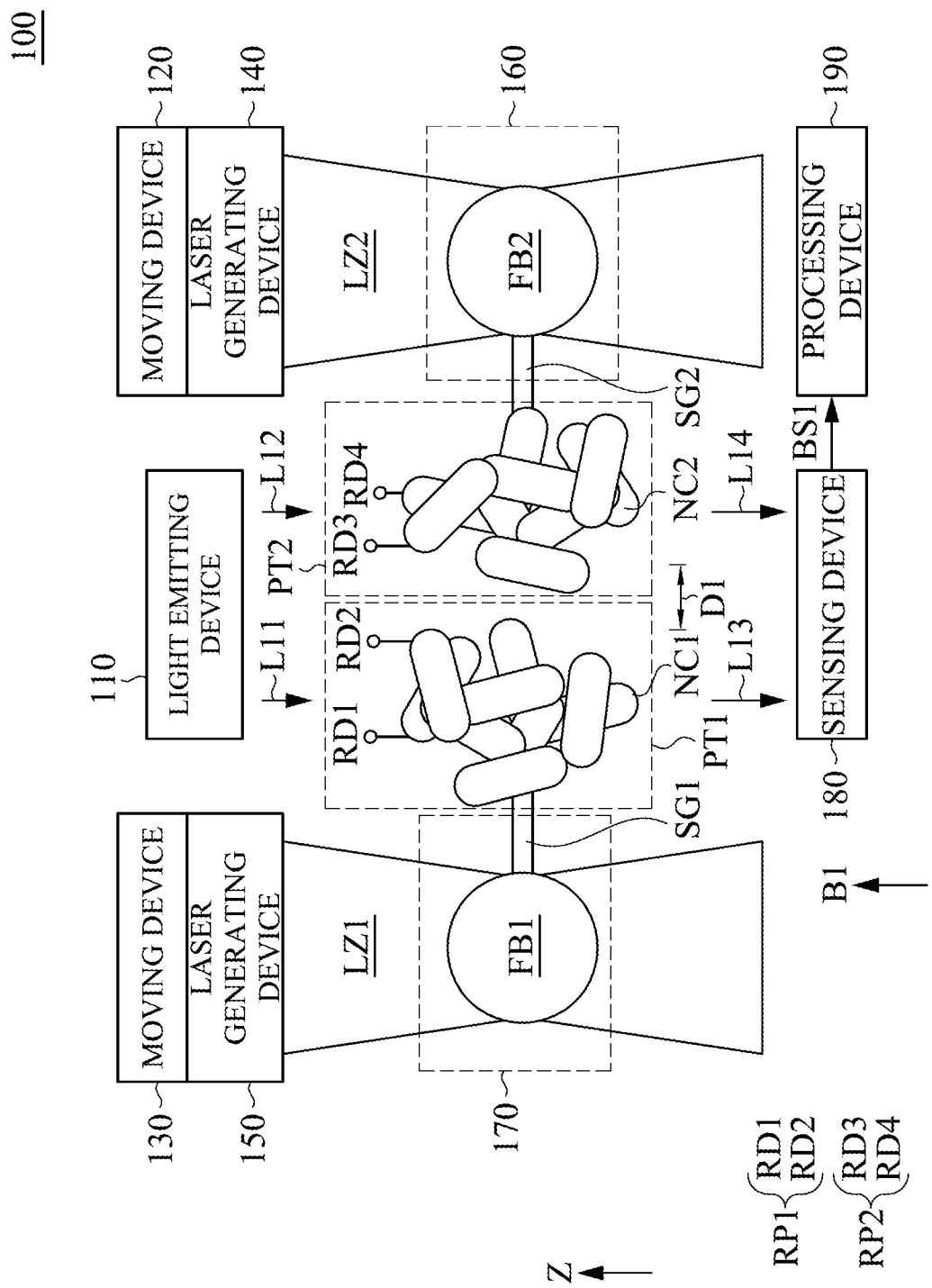
FIG. 1 is a schematic diagram of a magnetic field measuring system illustrated according to one embodiment of the present disclosure.

In the present disclosure, when an element is referred to as "connected" or "coupled", it may mean "electrically connected" or "electrically coupled". "Connected" or "coupled" can also be used to indicate that two or more components operate or interact with each other. In addition, although the terms "first", "second", and the like are used in the present disclosure to describe different elements, the terms are used only to distinguish the elements or operations described in the same technical terms. The use of the term is not intended to be a limitation of the present disclosure.

Unless otherwise defined, all terms (including technical and scientific terms) used in the present disclosure have the same meaning as commonly understood by the ordinary skilled person to which the concept of the present invention belongs. It will be further understood that terms (such as those defined in commonly used dictionaries) should be interpreted as having a meaning consistent with its meaning in the related technology and/or the context of this specification and not it should be interpreted in an idealized or overly formal sense, unless it is clearly defined as such in this article.

The terms used in the present disclosure are only used for the purpose of describing specific embodiments and are not intended to limit the embodiments. As used in the present disclosure, the singular forms "a", "one" and "the" are also intended to include plural forms, unless the context clearly indicates otherwise. It will be further understood that when used in this specification, the terms "comprises (comprising)" and/or "includes (including)" designate the existence of stated features, steps, operations, elements and/or components, but the existence or addition of one or more other features, steps, operations, elements, components, and/or groups thereof are not excluded.

Hereinafter multiple embodiments of the present disclosure will be disclosed with schema, as clearly stated, the details in many practices it will be explained in the following description. It should be appreciated, however, that the details in these practices is not applied to limit the present disclosure. Also, it is to say, in some embodiments of the present disclosure, the details in these practices are non-essential. In addition, for the sake of simplifying schema, some known usual structures and element in the drawings by a manner of simply illustrating for it.

FIG. 1 is a schematic diagram of a magnetic field measuring system 100 illustrated according to one embodiment of the present disclosure. In some embodiments, the magnetic field measuring system 100 is configured to measure a magnetic field B1 applied to the magnetic field measuring system 100.

In some embodiments, the magnetic field measuring system 100 may be a quantum measuring system, which includes particles PT1, PT2, a light emitting device 110, moving devices 120, 130, laser generating devices 140, 150, a fixing device 160, 170, a sensing device 180 and a processing device 190.

As illustratively shown in FIG. 1, the light emitting device 110 is configured to emit input lights L11 and L12 to the particles PT1, PT2. The particle PT1 is configured to generate an output light L13 according to the input light L11. The particle PT2 is configured to generate an output light L14 according to the input light L12. In some embodiments, wavelengths of the input lights L11 and L12 are approximately equal to 473 nanometers, and wavelengths of the output lights L13 and L14 are approximately equal to 550 nanometers. In various embodiments, the input lights L11 and L12 and the output lights L13 and L14 may have various wavelengths.

As illustratively shown in FIG. 1, the sensing device 180 is configured to receive at least one of the output lights L13 and L14, and configured to generate a readout signal BS1 according to at least one of the output lights L13 and L14. The processing device 190 performs calculations according to the readout signal BS1, to obtain a strength of the magnetic field B1.

In some embodiments, the particle PT1 includes a nucleus NC1 and a radical pair RP1, and the particle PT2 includes a nucleus NC2 and a radical pair RP2. The radical pair RP1 includes radicals RD1 and RD2, and the radical pair RP2 includes radicals RD3 and RD4. In some embodiments, the nucleuses NC1 and NC2 may be implemented by proteins or synthesized molecules. The radical pairs RP1 and RP2 may be implemented by lone pairs. The radicals RD1-RD4 may be implemented by electrons.

As illustratively shown in FIG. 1, a distance between the radicals RD2 and RD3 is shorter than a distance between the radicals RD2 and RD4, and the distance between the radicals RD2 and RD3 is shorter than a distance between the radicals RD1 and RD3. In some embodiments, a coupling strength G1 between the radicals RD2 and RD3 is stronger than each of a coupling strength between the radicals RD2 and RD4 and a coupling strength between the radicals RD1 and RD3.

In some embodiments, the magnetic field B1 is applied to the particles PT1 and PT2. The particle PT1 is configured to generate the output light L13 according to the input light L11, the magnetic field B1 and the coupling strength G1. The particle PT2 is configured to generate the output light L14 according to the input light L12, the magnetic field B1 and the coupling strength G1. In some embodiments, a strength of the output light L13 and a strength of the output light L14 are related with the coupling strength G1.

In some embodiments, a Hamiltonian function H representing energy of the particles PT1 and PT2 may be represented by equation (1) as following:

$$H = a \cdot S_{A1} \cdot I_1 + \theta(S_{A1}^Z + S_{B1}^Z) + a \cdot S_{B1} \cdot I_2 + \theta(S_{A2}^Z + S_{B2}^Z) + G1 \cdot S_{B1}^Z \cdot S_{B2}^Z \quad (1).$$

In some embodiments, in the equation (1), the "a" represents a coefficient of hyperfine interaction, the $S_{A1}$ corresponds to spin of the radical RD1, the $I_1$ corresponds to spin of the particle PT1, the $S_{B1}$ corresponds to spin of the radical RD2, the $I_2$ corresponds to spin of the particle PT2, the $S_{A1}^Z$ corresponds to a component of the spin of the radical RD1 on the Z-direction, the $S_{B1}^Z$ corresponds to a component of the spin of the radical RD2 on the Z-direction, the $S_{A2}^Z$ corresponds to a component of the spin of the radical RD4 on the Z-direction, the $S_{B2}^Z$ corresponds to a component of the spin of the radical RD3 on the Z-direction, and the θ corresponds to an external field applied to the particles PT1 and PT2. In some embodiments, the Z-direction is parallel with a direction of the magnetic field B1. In some embodiments, a relationship between the external field θ and the magnetic field B1 may be represented by equation (2) as following, in which the $\gamma_e$ is a constant:

$$B1 = \theta/\gamma_e \quad (2).$$

In some embodiments, corresponding to the Hamiltonian function H, the particles PT1 and PT2 have eigenstates |m> and |n>. It is noted that the m and n are positive integers. Energy corresponding to the eigenstates |m> and |n>, which are eigenvalues corresponding to the eigenstates |m> and |n>, include information of the external field θ and the coupling strength G1. Alternatively stated, the eigenvalues corresponding to the eigenstate |m> and |n> may change with respect to the change of the external field θ and/or the coupling strength G1.

In some embodiments, each of the strength of the output light L13 and the strength of the output light L14 may be represented by the function Φ(θ) shown in equation (3) as following. In some embodiments, the function Φ(θ) corresponds to a signal strength of the readout signal BS1, such as a current level or a voltage level of the readout signal BS1. In some embodiments, the signal strength of the readout signal BS1 corresponds to at least one of the strength of the output light L13 and the strength of the output light L14.

$$\Phi(\theta) = \frac{1}{M} \sum_{m=1}^{4M} \sum_{n=1}^{4M} \hat{P}_{mn} \cdot \rho_{mn} \cdot f(\omega_{mn}). \quad (3)$$

In some embodiments, the $\rho_{mn}$ in the equation (3) corresponds to a density function. The M is a positive integer. The $\omega_{mn}$ corresponds an energy difference between an energy level of the eigenstate |m> and an energy level of the eigenstate |n>. The $\hat{P}_{mn}$ may be represented by equation (4) as following. The $f(\omega_{mn})$ may be represented by equation (5) as following.

$$\hat{P}_{mn} = \langle m|\hat{P}|n \rangle. \quad (4)$$

-continued $$f(\omega_{mn}) = \frac{k^2}{k^2 + \omega_{mn}^2}. \quad (5)$$

In some embodiments, the $\hat{P}$ in the equation (4) corresponds to a projection operator. The k in the equation (5) is a constant number.

As the equation (1) to the equation (5) described above, the function $\Phi(\theta)$ changes with respect to the change of the external field $\theta$ and the coupling strength G1. According to calculations with the equation (1) to the equation (5), coupling strength values G11-G12 shown in following equations (6)-(7) are derived. The function $\Phi(\theta)$ has local peak values when the coupling strength G1 has the coupling strength values G11-G12.

$$G11 = \frac{1}{4}(\theta + (1 - \Omega)). \quad (6)$$

$$G12 = \frac{1}{4}(\theta - (1 - \Omega)). \quad (7)$$

In some embodiments, the function $\Omega$ in the equations (6)-(7) is a function of the external field $\theta$. Under a condition that the coupling strength values G11-G12 are known the strength of the external field $\theta$ may be derived by equation (8) as following.

$$\theta = 2 \cdot (G11 + G12) \quad (8)$$

In some embodiments, the processing device 190 is configured to perform the calculations of the equations (1)-(8). In various embodiments, the equations (1)-(8) have various forms.

As illustratively shown in FIG. 1, the fixing device 160 is configured to fix the particle PT2, and the fixing device 170 is configured to fix the particle PT1. The laser generating device 150 is configured to generate a laser LZ1, and is configured to position the fixing device 170 in the space by the laser LZ1. The laser generating device 140 is configured to generate a laser LZ2, and is configured to position the fixing device 160 in the space by the laser LZ2.

In some embodiments, the fixing device 170 includes a fixing body FB1 and a line segment SG1, and the fixing device 160 includes a fixing body FB2 and a line segment SG2. As illustratively shown in FIG. 1, the fixing body FB1 is configured to be fixed in the space by the laser LZ1, and the line segment SG1 is configured to connect the fixing body FB1 and the particle PT1. The fixing body FB2 is configured to be fixed in the space by the laser LZ2, and the line segment SG2 is configured to connect the fixing body FB2 and the particle PT2. In some embodiments, the fixing bodies FB1 and FB2 are implemented by plastic particles, and the line segments SG1 and SG2 are implemented by proteins. In various embodiments, the fixing bodies FB1 and FB2 and the line segments SG1 and SG2 may be implemented by various shapes and materials.

In some embodiments, the moving device 130 is configured to move a position of the laser generating device 150, such that a position of the laser LZ1 is changed, to adjust positions of the fixing device 170 and the particle PT1. The moving device 120 is configured to move a position of the laser generating device 140, such that a position of the laser LZ2 is changed, to adjust positions of the fixing device 160 and the particle PT2. As illustratively shown in FIG. 1, a distance D1 perpendicular with the Z direction is between the particles PT1 and PT2. The moving device 120 and 130 are configured to adjust the distance D1 by adjusting the positions of the particles PT1 and PT2.

In some embodiments, when the distance D1 is increased, the coupling strength G1 is decreased. When the distance D1 is decreased, the coupling strength G1 is increased. In some embodiments, the moving devices 120 and 130 are configured to adjust the coupling strength G1 by adjusting the distance D1, to change the signal strength of the readout signal BS1. Details associated with adjusting the coupling strength G1 are further described below with the embodiments associated with FIG. 2.

Figure 2:
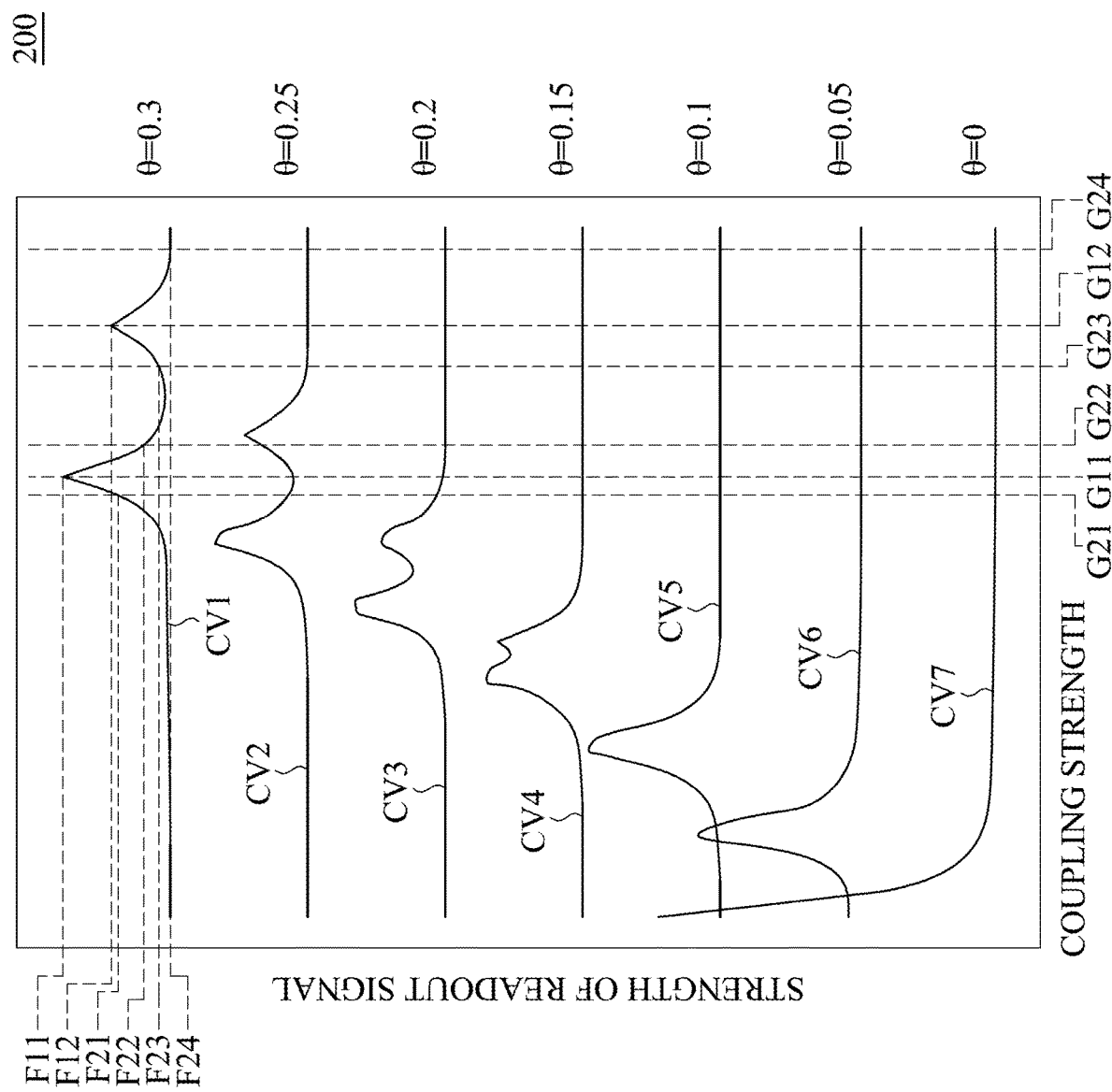
FIG. 2 is a relationship diagram of signal strength of a readout signal, a coupling strength and an external field, illustrated according to one embodiment of the present disclosure.

FIG. 2 is a relationship diagram 200 of a signal strength of the readout signal BS1, the coupling strength G1 and the external field $\theta$, illustrated according to one embodiment of the present disclosure. As illustratively shown in FIG. 2, a horizontal axis of the relationship diagram 200 corresponds to the coupling strength G1, and a vertical axis of the relationship diagram 200 corresponds to the signal strength of the readout signal BS1. The relationship diagram 200 includes curves CV1-CV7.

In some embodiments, the curves CV1-CV7 correspond to different strength of the external field $\theta$. In the embodiment shown in FIG. 2, the curves CV1-CV7 to the external field $\theta$ having strengths of 0.3, 0.25, 0.2, 0.15, 0.1, 0.05 and 0, respectively.

Referring to FIG. 1 and FIG. 2, when the external field $\theta$ (that is, the magnetic field B1) is applied to the particles PT1 and PT2, the moving devices 120 and 130 are configured to change the distance D1 to derive a corresponding one of the curves CV1-CV7, and derive corresponding local peak values. After the local peak values are derived, the strength of the external field $\theta$ may be calculated according to the local peak values.

An example is made following with the curve CV1 with the strength of the external field $\theta$ being 0.3. When the moving device 130 moves the particle PT1 toward the particle PT2 and/or when the moving device 120 moves the particle PT2 toward the particle PT1, the distance D1 is decreased gradually, such that the coupling strength G1 is increased gradually.

During the operations described above, the coupling strength G1 has the coupling strength values G21, G11, G22, G23, G12 and G24 in order. The sensing device 180 receives at least one of the output lights L13 and L14, to derive the signal strength values of the readout signal BS1 corresponding to the coupling strength values G21, G11, G22, G23, G12 and G24 in order.

As illustratively shown in FIG. 2, when the coupling strength G1 has the coupling strength value G21, the readout signal BS1 has a signal strength value F21. When the coupling strength G1 has the coupling strength value G11, the readout signal BS1 has a signal strength value F11. When the coupling strength G1 has the coupling strength value G22, the readout signal BS1 has a signal strength value F22. When the coupling strength G1 has the coupling strength value G23, the readout signal BS1 has a signal strength value F23. When the coupling strength G1 has the coupling strength value G12, the readout signal BS1 has a signal strength value F12. When the coupling strength G1 has the coupling strength value G24, the readout signal BS1 has a signal strength value F24.

As illustratively shown in FIG. 2, the signal strength value F11 is larger than the signal strength values F21 and F22, and the signal strength value F12 is larger than the signal strength values F23 and F24. Accordingly, the signal strength values F11 and F12 are the local peak values of the curve CV1. As a result, the processing device 190 shown in FIG. 1 may calculate the strength of the external field θ being 0.3 according to the equation (8) and the coupling strength values G11, G12 corresponding to the signal strength values F11 and F12.

For another example, when the moving device 130 moves the particle PT1 away from the particle PT2 and/or when the moving device 120 moves the particle PT2 away from the particle PT1, the distance D1 is increased gradually, such that the coupling strength G1 is decreased gradually.

During the operations described above, the coupling strength G1 has the coupling strength values G24, G12, G23, G22, G11 and G21 in order. The sensing device 180 receives at least one of the output lights L13 and L14, to derive the signal strength values of the readout signal BS1 corresponding to the coupling strength values G24, G12, G23, G22, G11 and G21 in order.

In various embodiments, the sensing device 180, the moving device 120 and 130 are configured to perform similar operations to derive the local peak values of the curves CV2-CV7, and calculate the strength of the external field θ according to the corresponding local peak values.

In some approaches, operating conditions with extremely low temperature is required for measuring device performing fine measurement to magnetic fields, or the space resolution of the measuring device is limited by the manufacturing process and cannot be changed easily.

Compare to above approaches, in embodiments of present disclosure, the sensing device 180 generates the readout signal BS1 corresponding to the magnetic field B1 according to the coupling strength G1 between the particle PT1 having the radical pair RP1 and the particle PT2 having the radical pair RP2. The magnetic field measuring system 100 does not need a low temperature circumstance to perform fine measurements to the magnetic field B1. In some embodiments, a sensitivity of the magnetic field measuring system 100 is approximately equal to $1nT/\sqrt{Hz}$, in which nT is nano-Tesla, and Hz is Hertz.

Furthermore, compare to above approaches, in embodiments of present disclosure, the moving devices 120 and 130 may be configured in various ways to have various space resolutions. In some embodiments, space resolutions of the magnetic field measuring system 100 can be smaller than 10 nanometers.

Figure 3B:
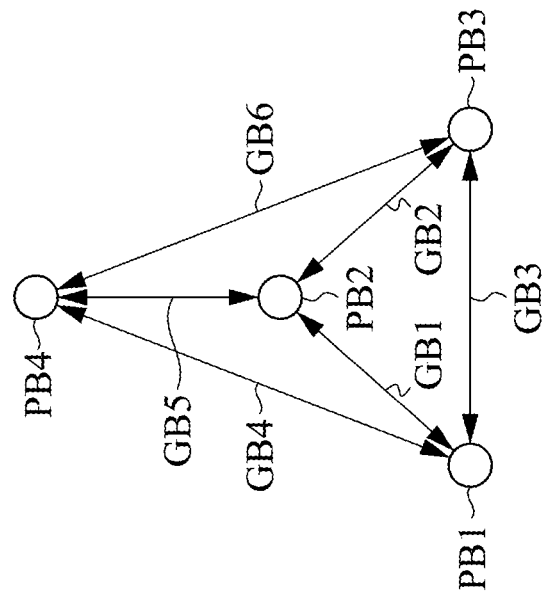
FIG. 3B is a schematic diagram of a magnetic field measuring system illustrated according to one embodiment of the present disclosure.
Figure 3A:
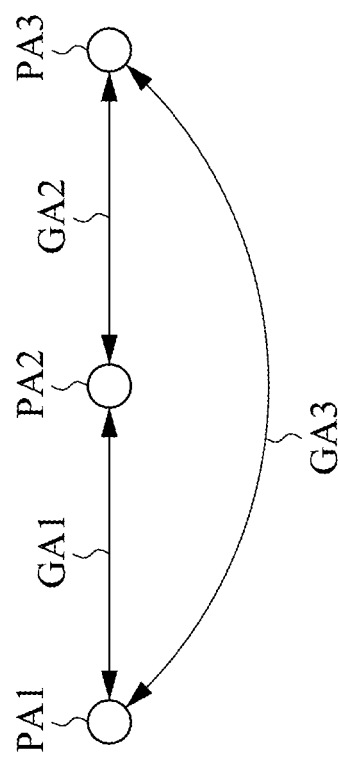
FIG. 3A is a schematic diagram of a magnetic field measuring system illustrated according to one embodiment of the present disclosure.

FIG. 3A is a schematic diagram of a magnetic field measuring system 300A illustrated according to one embodiment of the present disclosure. In some embodiments, the magnetic field measuring system 300A includes particles PA1-PA3. As illustratively shown in FIG. 3A, a coupling strength GA1 is between the particles PA1 and PA2. A coupling strength GA2 is between the particles PA3 and PA2. A coupling strength GA3 is between the particles PA1 and PA3. In some embodiments, each of the coupling strengths GA1-GA3 is affected by magnetic fields applied to the particles PA1-PA3. In some embodiments, the magnetic field measuring system 300A only performs operations according to a part of the coupling strengths GA1-GA3. For example, the magnetic field measuring system 300A may perform operations only according to the coupling strengths GA1 and GA2. In some embodiments, an all to all connection is not required between the particles PA1-PA3.

Referring to FIG. 1 and FIG. 3A, the magnetic field measuring system 300A is an alternative embodiment of the magnetic field measuring system 100. In some embodiments, configurations of two of the particles PA1-PA3 are similar with the configurations of the particles PT1 and PT2. Therefore, some descriptions are not repeated for brevity.

For example, in some embodiments, the fixing device 170 is configured to fix the particle PA1, and the fixing device 160 is configured to fix the particle PA2. The light emitting device 110 is configured to emit the input lights L11 and L12 to the particles PA1 and PA2, respectively. The particles PA1 and PA2 are configured to generate the output lights L13 and L14, respectively, according to the coupling strength GA1. The sensing device 180 is configured to generate the readout signal BS1 corresponding to the magnetic field applied to the particles PA1 and PA2 according to the output lights L13 and L14.

In some embodiments, the particles PA1 and PA2 are configured to generate the output lights L13 and L14 further according to the coupling strengths GA1-GA3. The sensing device 180 is configured to generate the readout signal BS1 corresponding to the magnetic field applied to the particles PA1-PA3 according to the output lights L13 and L14.

In some embodiments, the moving device 130 is configured to adjust a distance between the particles PA1 and PA2, to adjust the coupling strength GA1. In some embodiments, the moving device 130 is further configured to adjust a distance between the particles PA1 and PA3, to adjust the coupling strength GA3.

Similarly, in some embodiments, the moving device 140 is configured to adjust the distance between the particles PA1 and PA2, to adjust the coupling strength GA1. In some embodiments, the moving device 140 is further configured to adjust a distance between the particles PA2 and PA3, to adjust the coupling strength GA2.

In some embodiments, the magnetic field measuring system 300A further includes a moving device (not shown in figures) configured to control the particle PA3. The moving device controlling the particle PA3 is configured to adjust a distance between the particles PA1 and PA3, to adjust the coupling strength GA3. The moving device controlling the particle PA3 is further configured to adjust the distance between the particles PA2 and PA3, to adjust the coupling strength GA2.

FIG. 3B is a schematic diagram of a magnetic field measuring system 300B illustrated according to one embodiment of the present disclosure. In some embodiments, the magnetic field measuring system 300B includes particles PB1-PB4.

As illustratively shown in FIG. 3A, a coupling strength GB1 is between the particles PB1 and PB2. A coupling strength GB2 is between the particles PB3 and PB2. A coupling strength GB3 is between the particles PB1 and PB3. A coupling strength GB4 is between the particles PB1 and PB4. A coupling strength GB5 is between the particles PB4 and PB2. A coupling strength GB6 is between the particles PB4 and PB3. In some embodiments, each of the coupling strengths GB1-GB6 is affected by magnetic fields applied to the particles PB1-PB4. In some embodiments, the magnetic field measuring system 300B only performs operations according to a part of the coupling strengths GB1-GB6. For example, the magnetic field measuring system 300B may performs operations only according to the coupling strengths GB1, GB2 and GB5, without performing operations according to the coupling strengths GB3, GB4 and GB6. In some embodiments, an all to all connection is not required between the particles PB1-PB4.

Referring to FIG. 1 and FIG. 3B, the magnetic field measuring system 300B is an alternative embodiment of the magnetic field measuring system 100. In some embodiments, configurations of two of the particles PB1-PB4 are similar with the configurations of the particles PT1 and PT2. Therefore, some descriptions are not repeated for brevity.

For example, in some embodiments, the fixing device 170 is configured to fix the particle PB1, and the fixing device 160 is configured to fix the particle PB2. The light emitting device 110 is configured to emit the input lights L11 and L12 to the particles PB1 and PB2, respectively. The particles PB1 and PB2 are configured to generate the output lights L13 and L14, respectively, according to the coupling strength GB1. The sensing device 180 is configured to generate the readout signal BS1 corresponding to the magnetic field applied to the particles PB1 and PB2 according to the output lights L13 and L14.

In some embodiments, the particles PB1 and PB2 are configured to generate the output lights L13 and L14 further according to a part or all of the coupling strengths GB1-GB6. The sensing device 180 is configured to generate the readout signal BS1 corresponding to the magnetic field applied to the particles PB1-PB4 according to the output lights L13 and L14.

In some embodiments, the moving device 130 is configured to adjust a distance between the particles PB1 and PB2, to adjust the coupling strength GB1. The moving device 130 is further configured to adjust a distance between the particles PB1 and PB3, to adjust the coupling strength GB3. The moving device 130 is further configured to adjust a distance between the particles PB1 and PB4, to adjust the coupling strength GB4.

Similarly, in some embodiments, the moving device 140 is configured to adjust the distance between the particles PB1 and PB2, to adjust the coupling strength GB1. The moving device 140 is further configured to adjust a distance between the particles PB2 and PB3, to adjust the coupling strength GB2. The moving device 140 is further configured to adjust a distance between the particles PB2 and PB4, to adjust the coupling strength GB5.

In some embodiments, the magnetic field measuring system 300B further includes a moving device (not shown in figures) configured to control the particle PB3. The moving device controlling the particle PB3 is configured to adjust a distance between the particles PB1 and PB3, to adjust the coupling strength GB3. The moving device controlling the particle PB3 is further configured to adjust the distance between the particles PB2 and PB3, to adjust the coupling strength GB2. The moving device controlling the particle PB3 is further configured to adjust the distance between the particles PB4 and PB3, to adjust the coupling strength GB6.

In some embodiments, the magnetic field measuring system 300B further includes a moving device (not shown in figures) configured to control the particle PB4. The moving device controlling the particle PB4 is configured to adjust a distance between the particles PB1 and PB4, to adjust the coupling strength GB4. The moving device controlling the particle PB4 is further configured to adjust the distance between the particles PB2 and PB4, to adjust the coupling strength GB5. The moving device controlling the particle PB4 is further configured to adjust the distance between the particles PB4 and PB3, to adjust the coupling strength GB6.

Figure 4:
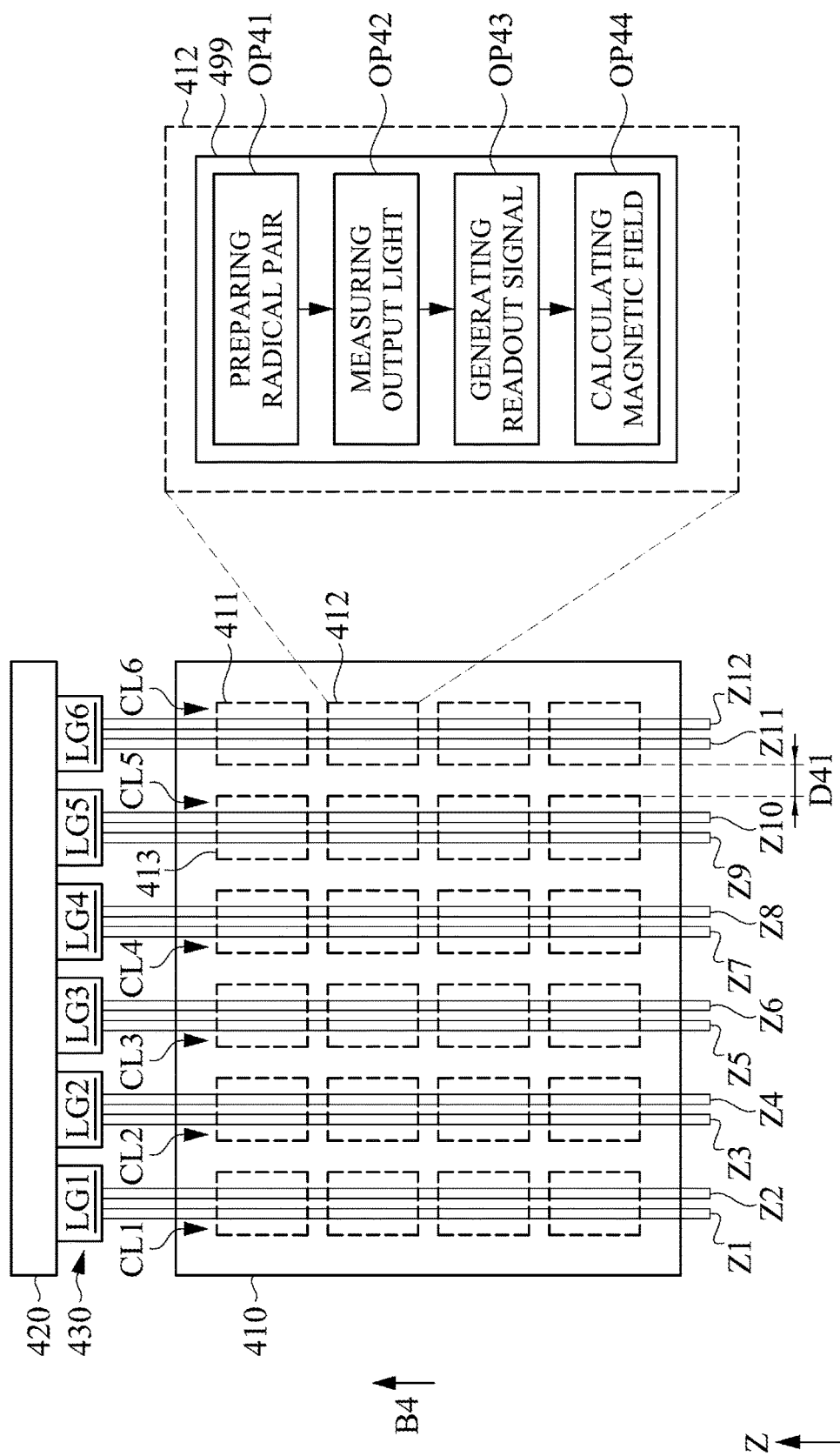
FIG. 4 is a schematic diagram of a magnetic field measuring apparatus illustrated according to one embodiment of the present disclosure.

FIG. 4 is a schematic diagram of a magnetic field measuring apparatus 400 illustrated according to one embodiment of the present disclosure. In some embodiments, the magnetic field measuring apparatus 400 includes a sensing block 410, a moving device 420 and a laser generating device group 430. As illustratively shown in FIG. 4, the sensing block 410, the laser generating device group 430 and the moving device 420 are arranged in order along the Z direction.

In some embodiments, the sensing block 410 is configured to sense a magnetic field B4 applied to the sensing block 410. The laser generating device group 430 is configured to emit lasers Z1-Z12 toward an opposite direction of the Z direction, to the sensing block 410. The moving device 420 is configured to move the laser generating device group 430. In some embodiments, a direction of the magnetic field B4 is the Z direction.

In some embodiments, the sensing block 410 includes sensing module columns CL1-CL6. In some embodiments, each of the sensing module columns CL1-CL6 is configured to sense a strength of the magnetic field B4 surrounding thereof. As illustratively shown in FIG. 4, the sensing module columns CL1-CL6 are arranged in order along an X direction different from the Z direction. In some embodiments, the X direction is perpendicular with the Z direction.

In some embodiments, the laser generating device group 430 includes laser generating devices LG1-LG6. As illustratively shown in FIG. 4, the laser generating devices LG1-LG6 arranged in order along the X direction. The laser generating device LG1 is configured to emit lasers Z1 and Z2 to the sensing module column CL1. The laser generating device LG2 is configured to emit lasers Z3 and Z4 to the sensing module column CL2. The laser generating device LG3 is configured to emit lasers Z5 and Z6 to the sensing module column CL3. The laser generating device LG4 is configured to emit lasers Z7 and Z8 to the sensing module column CL4. The laser generating device LG5 is configured to emit lasers Z9 and Z10 to the sensing module column CL5. The laser generating device LG6 is configured to emit lasers Z11 and Z12 to the sensing module column CL6.

In some embodiments, the moving device 420 is configured to move the laser generating devices LG1-LG6 to adjust positions of the sensing module columns CL1-CL6. For example, as illustratively shown in FIG. 4, a distance D41 is between the sensing module columns CL6 and CL5. The moving device 420 is configured to move the laser generating device LG5 toward the laser generating device LG6, to decrease the distance D41. For another example, the moving device 420 is configured to move the laser generating device LG5 away from the laser generating device LG6, to increase the distance D41.

In some approaches, the space resolution of measuring devices performing fine measurements to magnetic fields is limited by manufacturing process, and cannot be changed easily.

Compare to above approaches, in some embodiments of present disclosure, the moving device 420 may adjust the positions of the sensing module columns CL1-CL6, to adjust the space resolution of the magnetic field measuring apparatus 400. As a result, user can optimize the magnetic field measuring apparatus 400 according to the magnet field B4 which is desired to be measured.

In some embodiments, each of the sensing module columns CL1-CL6 includes multiple sensing modules arranged in order along the Z direction. Each of the sensing modules described above is configured to sense a strength of the magnetic field B4 surrounding thereof. In the embodiment shown in FIG. 4, the sensing module column CL6 includes sensing modules 411, 412 and other two sensing modules. The sensing module column CL5 includes a sensing module 413 and other three sensing modules. The sensing modules 412 and 411 are arranged in order along the Z direction. The sensing modules 413 and 411 are arranged in order along the X direction.

Referring to FIG. 1 and FIG. 4, the magnetic field measuring apparatus 400 is an alternative embodiment of the magnetic field measuring apparatus 100. The moving devices 120 and 130 correspond to the moving device 420.

The laser generating devices 140 and 150 correspond to the laser generating devices LG1-LG6. The light emitting device 110, the sensing device 180, the particles PT1, PT2, the fixing device 160, 170 and the processing device 190 correspond to the sensing modules in the sensing module columns CL1-CL6. The lasers Z1-Z12 correspond to the lasers LZ1 and LZ2. Therefore, some descriptions are not repeated for brevity.

For example, in some embodiments, the sensing module 412 includes the light emitting device 110, the sensing device 180, the particles PT1, PT2, the fixing devices 160, 170 and the processing device 190. The laser generating device LG6 includes the laser generating devices 140 and 150. The lasers Z11 and Z12 correspond to the lasers LZ1 and LZ2, respectively. The laser Z11 is configured to fix the fixing device 170. The laser Z12 is configured to fix the fixing device 160. The moving device 420 includes the moving device 120 and 130. A distance between the lasers Z11 and Z12 corresponds to the distance D1. The sensing module 412 is configured to measure the strength of the magnetic field B4 surrounding the sensing module 412, according to the coupling strength G1 between the particles PT1 and PT2.

For another example, in some embodiments, the sensing module 411 includes the light emitting device 110, the sensing device 180, the particles PT1, PT2, the fixing devices 160, 170 and the processing device 190. The laser generating device LG6 includes the laser generating devices 140 and 150. The lasers Z11 and Z12 correspond to the lasers LZ1 and LZ2, respectively. The laser Z11 is configured to fix the fixing device 170. The laser Z12 is configured to fix the fixing device 160. The moving device 420 includes the moving device 120 and 130. A distance between the lasers Z11 and Z12 corresponds to the distance D1. The sensing module 411 is configured to measure the strength of the magnetic field B4 surrounding the sensing module 411, according to the coupling strength G1 between the particles PT1 and PT2. In some embodiments, particles in the sensing modules 411 and 412 are positioned by the same lasers Z11 and Z12.

In some embodiments, other sensing modules in the sensing module columns CL1-CL6 have configurations similar with the configurations of the sensing module 412 described above. For example, the sensing module 413 includes a first particle corresponding to the particle PT1 and a second particle corresponding to the particle PT2. The laser Z9 is configured to fix the first particle. The laser Z10 is configured to fix the second particle. The moving device 420 is configured to move positions of the lasers Z9 and Z10, to adjust a coupling strength between the first particle and the second particle. The sensing module is configured to calculate a strength of the magnetic field B4 surrounding the sensing module 413, according to the coupling strength between the first particle and the second particle.

In some embodiments, the moving device 420 is further configured to move positions of the lasers Z11 and Z10, to adjust the distance D41 between the second particle and the particle PT1 in the sensing module 412, to adjust the space resolution of the magnetic field measuring apparatus 400.

As illustratively shown in FIG. 4, the sensing module in the sensing module columns CL1-CL6, such as the sensing module 412, is configured to perform a method 499. The method 499 includes operations OP41-OP44.

In some embodiments, at the operation OP41, radical pairs are prepared. For example, the particles PT1 and PT2 having the radical pairs RP1 and RP2 are fixed by the fixing devices 170 and 160, and the distance D1 is adjusted by the moving devices 120 and 130.

In some embodiments, at the operation OP42, output lights of the radical pairs are measured. For example, the sensing device 180 performs the measurements to the strengths of the output lights L13 and L14.

In some embodiments, at the operation OP43, a readout signal is generated according to the output lights. For example, the sensing device 180 generates the readout signal BS1 according to the strengths of the output lights L13 and L14.

In some embodiments, at the operation OP44, the strength of the magnetic field is calculated according to the readout signal. For example, the processing device 190 performs the calculations according to the readout signal BS1 and the equations (1)-(8), to calculate the strength of the magnetic field B1 or B4. In various embodiments, the processing device 190 may be located at inside or outside of the sensing module 412.

Although the present disclosure has been described in considerable detail with reference to certain embodiments thereof, other embodiments are possible. Therefore, the spirit and scope of the appended claims should not be limited to the description of the embodiments contained in the present disclosure.

It will be apparent to those skilled in the art that various modifications and variations can be made to the structure of the present disclosure without departing from the scope or spirit of the disclosure. In view of the foregoing, it is intended that the present disclosure cover modifications and variations of the present disclosure provided they fall within the scope of the following claims.

What is claimed is:

1. A magnetic field measuring method, comprising:
applying a magnetic field to a first particle and a second particle;
generating a first output light by the first particle according to the magnetic field and a first coupling strength between the first particle and the second particle;
calculating a strength of the magnetic field according to a strength of the first output light;
fixing the first particle by a first laser; and
fixing the second particle by a second laser,
wherein generating the first output light comprises adjusting a distance between the first particle and the second particle, to adjust the first coupling strength, and
adjusting the distance comprises adjusting at least one of a position of the first laser and a position of the second laser.

2. The magnetic field measuring method of claim 1, wherein generating the first output light further comprises:
adjusting the strength of the first output light by adjusting the first coupling strength.

3. The magnetic field measuring method of claim 2, wherein a direction of the magnetic field is perpendicular with the distance.

4. The magnetic field measuring method of claim 1, wherein calculating the strength of the magnetic field comprises:
generating a readout signal according to the strength of the first output light; and
calculating the strength of the magnetic field according to at least one coupling strength value of the first coupling strength corresponding to at least one local peak value of the readout signal.

5. The magnetic field measuring method of claim 1, further comprising:

applying the magnetic field to a third particle,
wherein generating the first output light comprises:
generating the first output light according to a second coupling strength between the third particle and the second particle and a third coupling strength between the third particle and the first particle.

6. The magnetic field measuring method of claim 1, further comprising:
generating a second output light by the second particle according to the first coupling strength; and
calculating the strength of the magnetic field according to a strength of the second output light.

7. The magnetic field measuring method of claim 1, wherein the first coupling strength is a coupling strength between a radical of a first radical pair and a radical of a second radical pair.

8. A magnetic field measuring system, comprising:
a first particle configured to generate a first output light according to a first coupling strength and a magnetic field;
a second particle configured to be coupled to the first particle with the first coupling strength;
a sensing device configured to generate a readout signal corresponding to a strength of the magnetic field according to a strength of the first output light; and
a first fixing device comprising a first fixing body and a first line segment, the first line segment connecting the first fixing body and the first particle, to fix the first particle.

9. The magnetic field measuring system of claim 8, wherein a distance between the first particle and the second particle is adjust, to adjust the first coupling strength,
wherein the distance is perpendicular with a direction of the magnetic field.

10. The magnetic field measuring system of claim 9, further comprising:
a processing device configured to calculate the strength of the magnetic field according to at least one coupling strength value of the first coupling strength corresponding to at least one local peak value of the readout signal, after the distance is adjusted.

11. The magnetic field measuring system of claim 9, further comprising:
a first laser generating device configured to generate a first laser to position the first fixing device in space.

12. The magnetic field measuring system of claim 11, further comprising:
a second fixing device comprising a second fixing body and a second line segment, the first line segment connecting the second fixing body and the second particle, to fix the second particle; and
a second laser generating device configured to generate a second laser to position the second fixing device in space.

13. The magnetic field measuring system of claim 8, further comprising:
a third particle configured to be coupled to the first particle with a second coupling strength, and configured to be coupled to the second particle with a third coupling strength,
wherein the first particle is further configured to generate the first output light according to the second coupling strength and the third coupling strength.

14. The magnetic field measuring system of claim 13, further comprising:

a fourth particle configured to be coupled to the first particle with a fourth coupling strength, configured to be coupled to the second particle with a fifth coupling strength, and configured to be coupled to the third particle with a sixth coupling strength,
wherein the first particle is further configured to generate the first output light according to the fourth coupling strength, the fifth coupling strength and the sixth coupling strength.

15. The magnetic field measuring system of claim 8, wherein
the first particle comprises a first radical pair comprising a first radical and a second radical,
the second particle comprises a second radical pair comprising a third radical and a fourth radical,
the first coupling strength is a coupling strength between the second radical and the third radical,
a distance between the first radical and the third radical is larger than a distance between the second radical and the third radical, and
a distance between the second radical and the fourth radical is larger than the distance between the second radical and the third radical.

16. A magnetic field measuring apparatus, comprising:
a first sensing module configured to calculate a first strength of a magnet field surrounding the first sensing module;
a second sensing module configured to calculate a second strength of the magnet field surrounding the second sensing module;
a first laser generating device configured to position the first sensing module; and
a second laser generating device configured to position the second sensing module,
wherein at least one of the first laser generating device and the second laser generating device is moved, to adjust a distance between the first sensing module and the second sensing module.

17. The magnetic field measuring apparatus of claim 16, wherein the first sensing module comprising:
a processing device configured to calculate the first strength of the magnet field surrounding the first sensing module according to a coupling strength between a first particle and a second particle,
wherein the first laser generating device is further configured to generate a laser, and fix the first particle by the laser.

18. The magnetic field measuring apparatus of claim 17, wherein a direction of the laser is perpendicular with a direction of the distance.

19. The magnetic field measuring apparatus of claim 17, further comprising:
a third sensing module comprising a third particle and a fourth particle, the third sensing module configured to calculate a third strength of the magnet field surrounding the third sensing module according to a coupling strength between the third particle and the fourth particle,
wherein the first laser generating device is further configured to fix the third particle by the laser.

* * * * *